United States Patent [19]

Enomoto

[11] Patent Number: 5,385,859
[45] Date of Patent: Jan. 31, 1995

[54] METHOD FOR FABRICATING A SEMICONDUCTOR DEVICE HAVING A CAPACITOR WITH A CONDUCTIVE PLUG STRUCTURE IN A STACKED MEMORY CELL

[75] Inventor: Shuichi Enomoto, Tokyo, Japan

[73] Assignee: NEC Corporation, Japan

[21] Appl. No.: 97,395

[22] Filed: Jul. 23, 1993

[30] Foreign Application Priority Data

Jul. 23, 1992 [JP] Japan .................. 4-217201

[51] Int. Cl.⁶ ............... H01L 21/70; H01L 27/00
[52] U.S. Cl. ...................... 437/52; 437/60; 437/919
[58] Field of Search ............ 437/47, 52, 60, 919; 257/308

[56] References Cited

U.S. PATENT DOCUMENTS

| | | | |
|---|---|---|---|
| 5,071,783 | 12/1991 | Taguchi et al. | 437/52 |
| 5,134,086 | 7/1992 | Ahn | 437/52 |
| 5,164,337 | 11/1992 | Ogawa et al. | 437/52 |
| 5,175,121 | 12/1992 | Choi et al. | 437/60 |
| 5,192,703 | 3/1993 | Lee et al. | 437/52 |

FOREIGN PATENT DOCUMENTS 2244759 9/1990 Japan .

Primary Examiner—Olik Chaudhuri
Assistant Examiner—H. Jey Tsai
Attorney, Agent, or Firm—Laff, Whitesel, Conte & Saret, Ltd.

[57] ABSTRACT

A method for fabricating a semiconductor device includes steps of: (a) forming a MIS type transistor having a gate electrode and a first source/drain region and a second source/drain on a semiconductor substrate, (b) forming a contact hole by causing an insulating layer and a pad material layer to grow over the semiconductor substrate. and removing selectively the insulating layer and the pad material layer to expose the first source/drain regions, (c) forming a conductive plug, which fills inside the contact hole, by forming a first conductive material layer and etching back this layer in such a way as to leave this layer only in the contact hole, and (d) forming a capacitor which has a first electrode being in contact with the conductive plug and extending in a cantilever-like form from the conductive plug, a dielectric film covering a surface of the first electrode, and a second electrode surrounding the first electrode through the dielectric film. In view of the presence of the conductive plug, the physical strength of the first electrode is enhanced and hence the production yield is enhanced.

4 Claims, 5 Drawing Sheets

METHOD FOR FABRICATING A SEMICONDUCTOR DEVICE HAVING A CAPACITOR WITH A CONDUCTIVE PLUG STRUCTURE IN A STACKED MEMORY CELL

BACKGROUND OF THE INVENTION (1) Field of the Invention

The present invention relates to a method for fabricating a semiconductor device, and more particularly to a semiconductor device having a stacked capacitor type memory cell.

(2) Description of the Related Art

A conventional stacked capacitor type memory cell is shown in sectional view in FIG. 1. As seen therein, there are provided a p-type silicon substrate 901; a field oxide film 902 formed on the silicon substrate 901 by a LOCOS (local oxidation of silicon) method for element isolation; a gate oxide film 903; a gate electrode 904 which functions also as a word line; a first n-type diffusion layer 905 and a second n-type diffusion layer 906 which respectively constitute a first source/drain region and a second source/drain region; a silicon oxide film 907 which covers a transistor; a first contact hole 910 formed in the silicon oxide film 907 for establishing contact with the first n-type diffusion layer 905; a first electrode 912 of a capacitor which is in contact with the first n-type diffusion layer 905 through the first contact hole 910; a dielectric film 913; a second electrode 914 of the capacitor which surrounds the first electrode 912 through the dielectric film 913; an interlayer insulating film 915 of BPSG (Boro-phospho-silicate glass); a second contact hole 916 formed in the interlayer insulating film 915 and the silicon oxide film 907 for establishing contact with the second n-type diffusion layer 906; and a bit line 917 of Al (aluminum) which is in contact with the second n-type diffusion layer 906 through the second contact hole 916.

FIGS. 2A–2D show, in sectional views, sequential fabrication steps of the method for fabricating the conventional stacked capacitor type memory cell described above.

First, FIG. 2A is referred to. After the field oxide film 902 is formed by selectively oxidizing a surface of the p-type silicon substrate 901, a surface of the active region that is not covered by the field oxide film 902 is oxidized to form the gate oxide film 903. Polycrystalline silicon containing impurities is caused to grow on the entire surface and, then, the resulting film is patterned to form the gate electrode 904. Thereafter, arsenic (As) is ion-implanted in the entire surface to form the n-type diffusion layers 905 and 906 which serve as source/drain regions.

Next, as seen in FIG. 2B, the silicon oxide film 907 and the silicon nitride film 908 as a pad material are caused to grow on the entire surface by using a chemical vapor deposition (CVD) process and, then, the first contact hole 910 is formed on the first n-type diffusion layer 905 by opening the silicon oxide film 907 and the silicon nitride film 908. Then, the impurity doped polycrystalline silicon film 912a is formed on the entire surface.

Referring to FIG. 2C, the resulting films are subjected to the patterning in such a way as to leave the polycrystalline silicon film 912a, which contains the first contact hole 910, and the silicon nitride film 908, whereby the first electrode 912 of the capacitor is formed. Thereafter, as shown in FIG. 2D, the silicon nitride film 908 under the first electrode 912 is removed by wet-etching. Then, by performing thermal oxidation, the dielectric film 913 is formed on the surface of the first electrode 912.

Next, the doped polycrystalline silicon film is caused to grow on the entire surface so as to have the first electrode 912 surrounded thereby, and this film is patterned into a shape that leaves in place the portion of the film that faces the first electrode 912, whereby the second electrode 914 of the capacitor is formed. This is followed by the growth of the interlayer insulating film 915 on the entire surface, and the second contact hole 916 is formed in this film and the silicon oxide film 907 to establish contact with the second n-type diffusion layer 906. Finally, an Al (aluminum) film is deposited by a spattering method and is patterned to form a bit line 917, which completes the fabrication of the semiconductor device as shown in FIG. 1.

In the conventional semiconductor device explained above, the first electrode 912 of the capacitor is in direct contact with the first n-type diffusion layer 905 so that, from the time when the silicon nitride film 908 is removed to the time when the polycrystalline silicon film is deposited for forming the second electrode 914, the weight of the outwardly extended portion of the first electrode 912 must be supported by the vertical portion of the first electrode 912 and, thus, this vertical portion is under a heavy stress. This tends to cause cracks to occur in the vertical portion resulting in the development of breakage therein due even to a small external force during the fabrication of the device with the production yield greatly lowered. Where such breakage has developed in the first electrode 912, the broken part may adhere as a foreign matter to other parts or devices on the wafer, resulting in secondary causes for the occurrence of defects in the product.

SUMMARY OF THE INVENTION

It is, therefore, an object of the present invention to overcome the problems existing in the conventional method for fabricating a semiconductor device as described above and to provide an improved method with which the production yield is enhanced.

According to one aspect of the invention, there is provided a method for fabricating a semiconductor device having a memory cell of stacked capacitor type, comprising the steps of:

forming a MIS type transistor having a gate electrode and a first source/drain region and a second source/drain region within a region defined by an element isolation region on a semiconductor substrate;

forming a contact hole by causing an insulating layer and a pad material layer to grow over the semiconductor substrate, and selectively removing the insulating layer and the pad material layer to expose one of the first and second source/drain regions of the MIS type transistor:

forming a conductive plug, which fills inside the contact hole, by forming a first conductive material layer and etching back this layer;

forming a first electrode, which is in contact with an upper surface of the conductive plug and extends in a cantilever-like form from the conductive plug, by forming a second conductive material layer and, after patterning this layer, etching and removing the pad material layer;

forming a dielectric film on a surface of the first electrode; and forming a second electrode, which surrounds the first electrode through the dielectric film, by depositing a third conductive material layer and patterning this layer.

Since the semiconductor device according to the invention is such that the first electrode serving as a charge storage node is formed by the plate-like or cantilever-like member extending outwardly from the conductive plug member, the physical strength of the first electrode is enhanced. Thus, according to the invention, it is possible to prevent the occurrence of cracks or breakage in the polycrystalline silicon film as the first electrode during the fabrication processes and this results in the enhancement of the production yield. Also, since there is no possibility of a broken part adhering as a foreign matter to other parts or devices on the wafer, this ensures to suppress any secondary causes for the occurrence of defects in the product.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, a method for fabricating a semiconductor device having a stacked capacitor type memory cell will be described with reference to the accompanying drawings.

Figure 1:
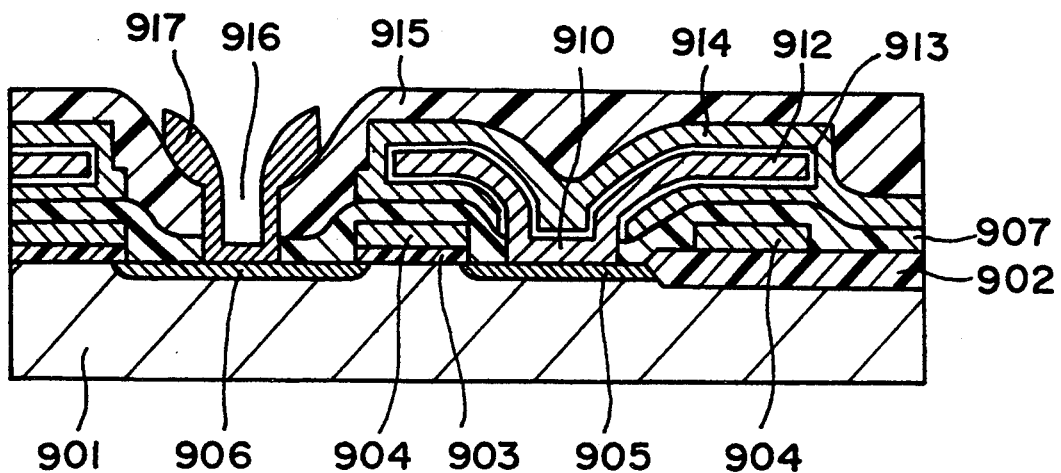
FIG. 1 is a sectional view illustrating a conventional structure of the semiconductor device.
Figure 2A:
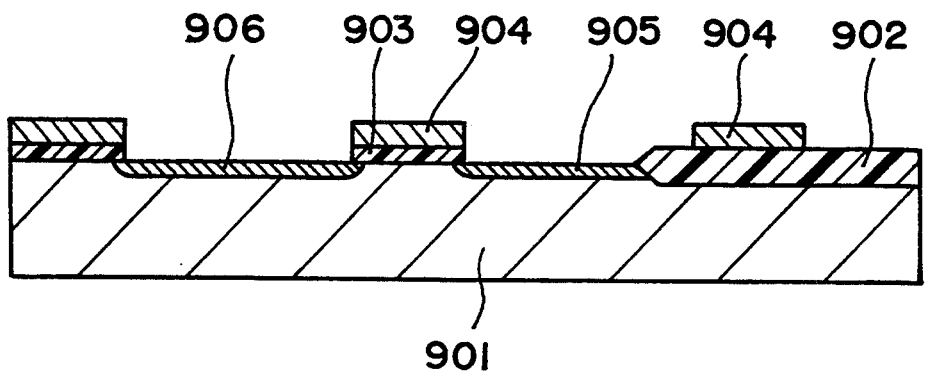
FIGS. 2A-2D are sectional views illustrating sequential steps in fabricating the conventional structure of the semiconductor device shown in FIG. 1.
Figure 2B:
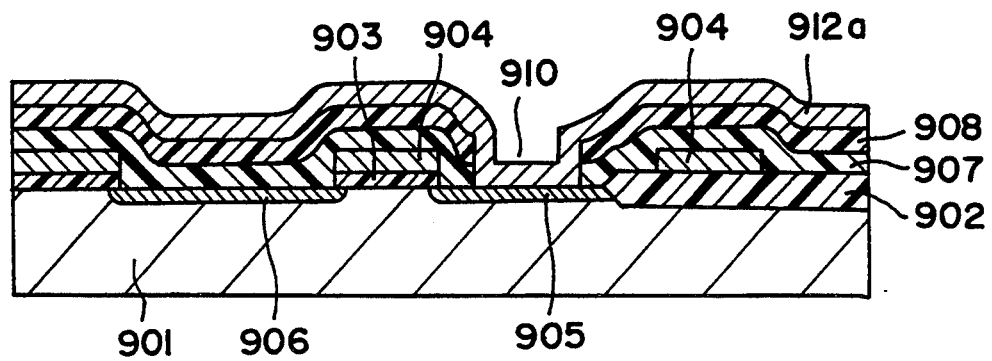
Figure 2C:
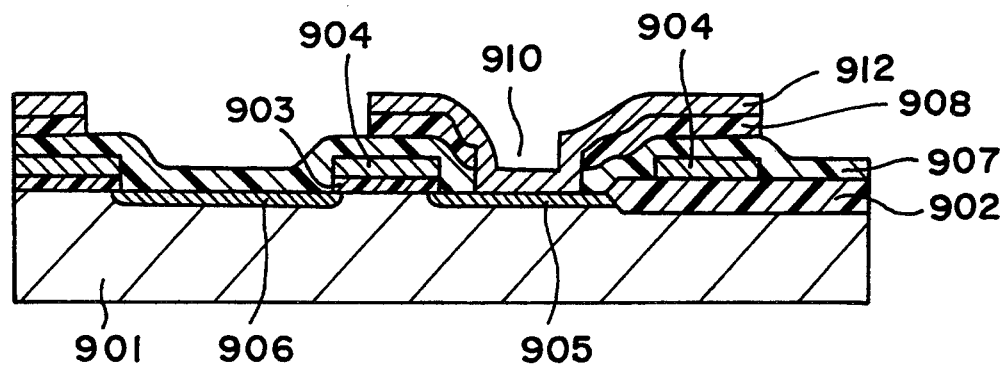
Figure 2D:
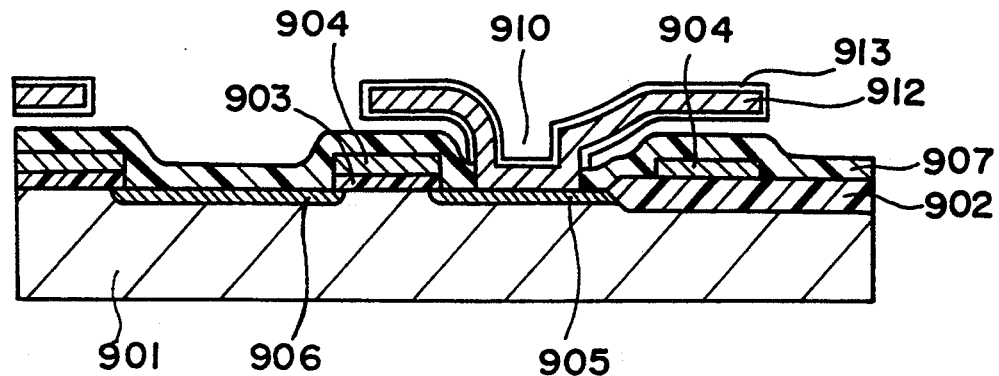
Figure 3:
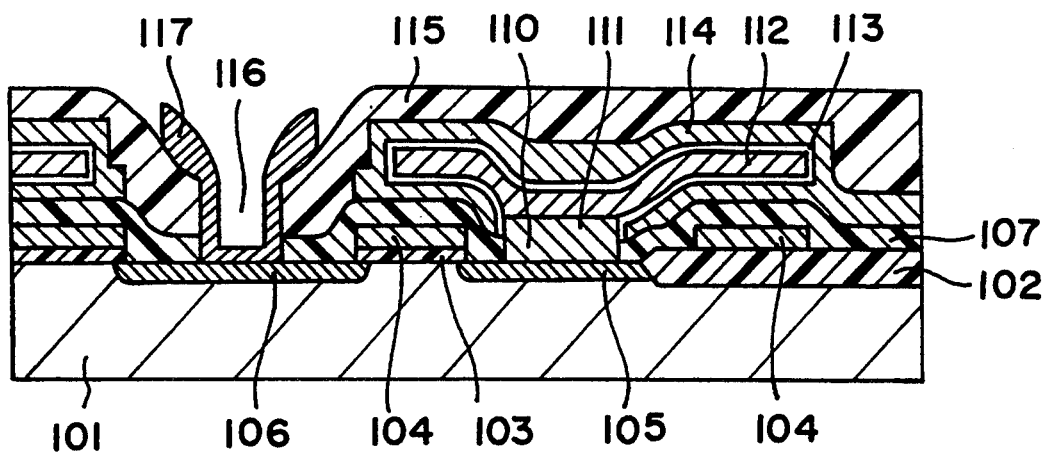
FIG. 3 is a sectional view illustrating a structure of a first embodiment of the semiconductor device according to the present invention.

FIG. 3 illustrates in sectional view a first embodiment of the invention.

As seen in FIG. 3, a field oxide film 102 as an element isolation film is formed on a p-type silicon substrate 101 and, in the active region defined by the field oxide film 102, there is formed a MIS (metal insulator semiconductor) type transistor having a gate oxide film 103, a gate electrode 104 and n-type diffusion layers 105, 106 constituting source/drain regions.

The MIS type transistor described above is covered by a first silicon oxide film 107 in which a first contact hole 110 is formed on the first n-type diffusion layer 105 and, in the first contact hole 110, it should be noted that there is provided a silicon plug 111 which projects upwards from a surface of the first silicon oxide film 107.

A first electrode 112 of a capacitor is connected to a top surface of the silicon plug 111, and a dielectric film 113 and a second electrode 114 for forming the capacitor together with the first electrode 112 are formed so as to surround the first electrode 112. The entire surface of the structure thus formed is covered with an interlayer insulating film 115 of BPSG, and a bit line 117 is connected to the second n-type diffusion layer 106 through a second contact hole 116 formed in the interlayer insulating film 115 and the first silicon oxide film 107.

FIGS. 4A-4D illustrate in sectional views the sequential fabrication steps for the method for fabricating the device of the first embodiment shown in FIG. 3.

Figure 4A:
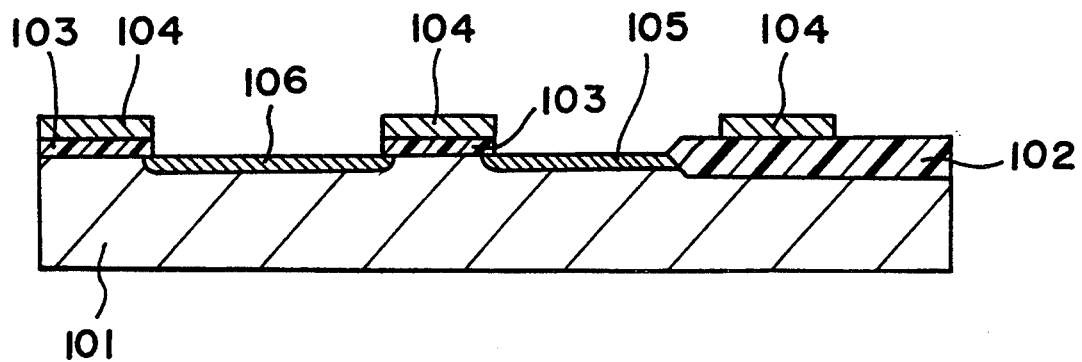
FIGS. 4A-4D are sectional views illustrating sequential steps in fabricating the structure of the first embodiment shown in FIG. 3.

First, FIG. 4A is referred to. A surface of the silicon substrate 101 is selectively oxidized to form the field oxide film 102 having a thickness of 6000 Angstroms. Then, by thermal oxidation method, a gate oxide film 103 having a thickness of 150 Angstroms is formed on the active layer region that has not been covered by the field oxide film 102, and a doped polycrystalline silicon film having a thickness of 3000 Angstroms is caused to grow on the entire surface and this film is patterned to form the gate electrode 104. Next, by using the field oxide film 102 and the gate electrode 104 as masks, As (arsenic) is ion-implanted to form the n-type diffusion layers 105 and 106 to become source/drain regions.

Figure 4B:
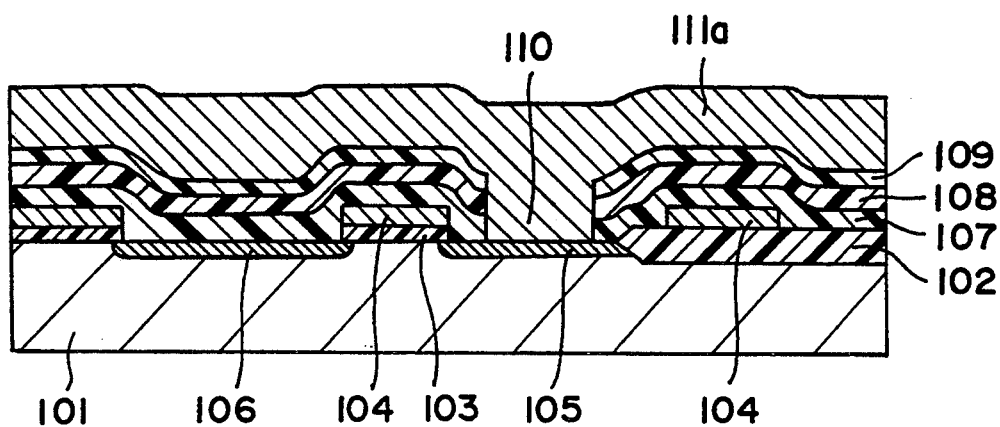

Next, as seen in FIG. 4B, by using the CVD process, the first silicon oxide film 107, the silicon nitride film 108 as a pad material and the second silicon oxide film 109 having thicknesses, respectively, of 2000 Angstroms, 2000 Angstroms and 1000 Angstroms are formed on the entire surface of the structure. After the contact hole 110 is formed in these three film layers on the first n-type diffusion layer 105, doped polycrystalline silicon is deposited on the entire surface to form a polycrystalline silicon film 111a having a thickness of 15000 Angstroms.

Figure 4C:
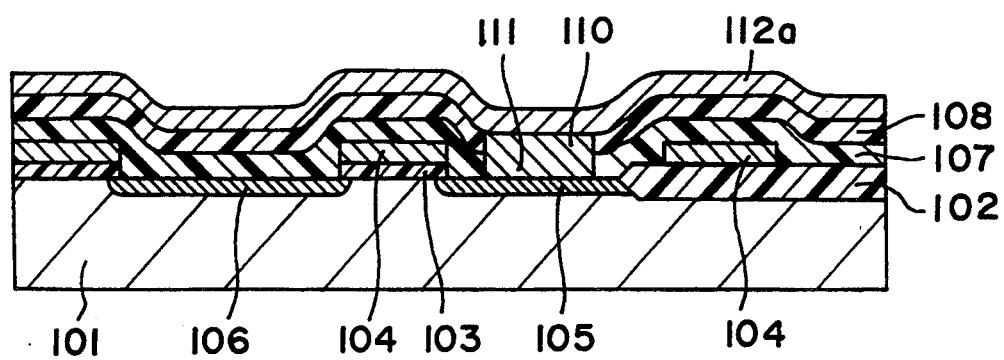

Then, as seen in FIG. 4C, the polycrystalline silicon film 111a is etched back in such a way that this film is left only in the first contact hole 110 to form the silicon plug 111. In this etching process step, the second silicon oxide film 109 functions as an etching stopper. After the second silicon oxide film 109 is etched and removed, a polycrystalline silicon film 112a having a thickness of 2000 Angstroms is caused to grow on the entire surface.

Figure 4D:
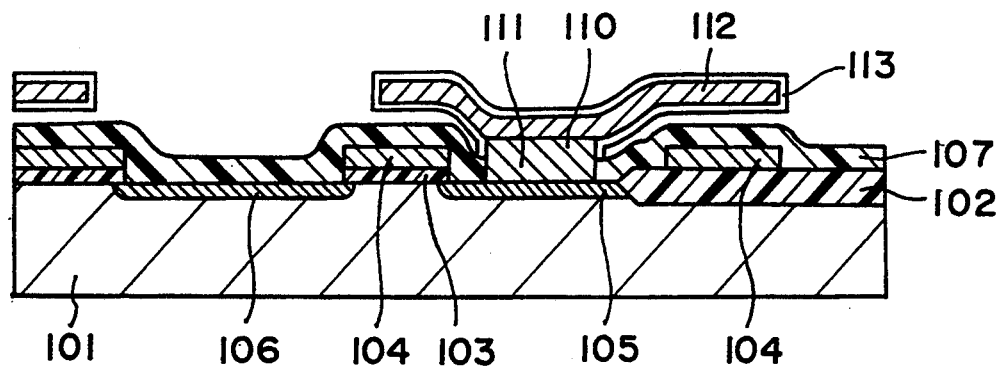

Next, as seen in FIG. 4D, the polycrystalline silicon film 112a and the silicon nitride film 108 are patterned and, after the first electrode 112 is formed, the silicon nitride film 108 under the first electrode 112 is removed by wet-etching. Then, by performing thermal oxidation, a dielectric film 113 having a thickness of 80 Angstroms is formed on a surface of the first electrode 112 and on partial sides of the silicon plug 111.

A doped polycrystalline silicon film having a thickness of 2000 Angstroms is formed on the entire surface of the structure, and is patterned to a shape surrounding the first electrode 112, whereby the second electrode 114 is formed. Also, on the entire surface thereof, a BPSG film is caused to grow to form the interlayer insulating film 115. In this interlayer insulating film 115 and the first silicon oxide film 107, there is opened the second contact hole 116 so as to expose a surface of the second n-type diffusion layer 106. Then, by forming the bit line 117 in contact with the second n-type diffusion layer 106 through the contact hole 116, the fabrication of the semiconductor as shown in FIG. 3 is completed.

Figure 5:
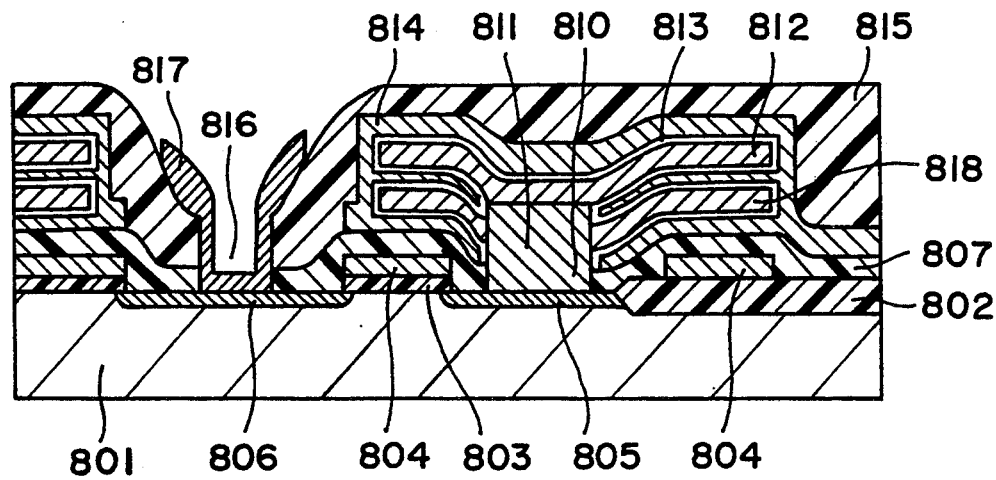
FIG. 5 is a sectional view illustrating a structure of a second embodiment of the semiconductor device according to the present invention.
Figure 6A:
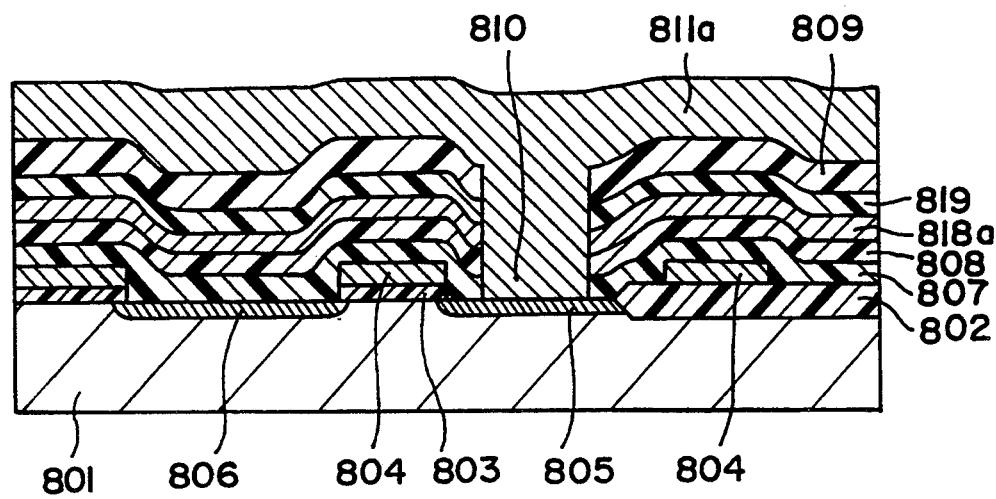
FIGS. 6A and 6B are sectional views illustrating principal fabrication steps in fabricating the structure of the second embodiment shown in FIG. 5.
Figure 6B:
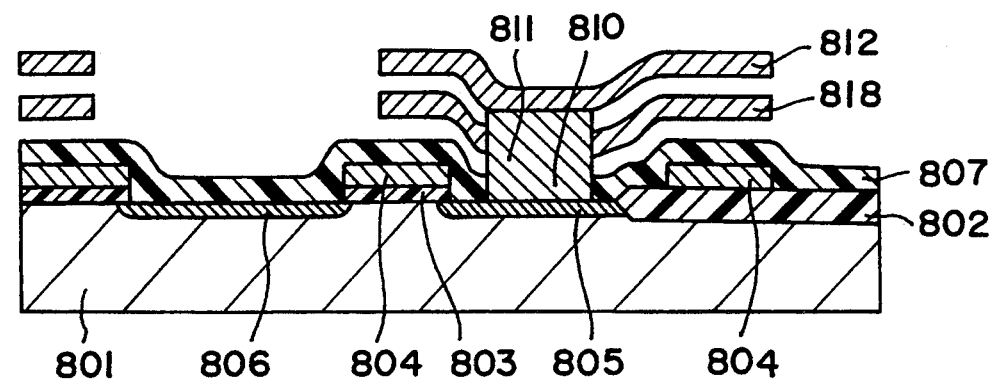

FIG. 5 shows in sectional view a structure of the second embodiment of the invention, and FIGS. 6A and 6B illustrate the principal fabrication steps of the method for fabricating the structure shown in FIG. 5.

The steps followed are similar to those used in the fabrication of the structure of the first embodiment. After a field oxide film 802 is formed selectively on a silicon substrate 801, there is formed, within a region defined by the field oxide film 802, a transistor having a gate oxide film 803, a gate electrode 804 and n-type diffusion layers 805 and 806.

Next, by using the CVD process, a first silicon oxide film 807, a first silicon nitride film 808 as a pad material, a polycrystalline silicon film 818a, a second silicon nitride film 819 as a pad material and a second silicon oxide film 809 having thicknesses, respectively, of 2000 Angstroms are formed on the entire surface of the structure. After a first contact hole 810 is formed in these stacked film layers to expose a surface of the first n-type diffusion layer 805, doped polycrystalline silicon is deposited on the entire surface to form a polycrystalline silicon film 811a having a thickness of 15000 Angstroms as shown in FIG. 6A.

The polycrystalline silicon film 811a is etched back and, after the formation of a silicon plug 811 filling the inside of the first contact hole 810, the second silicon oxide film 809 is etched and removed.

Next, a doped polycrystalline silicon film is formed, and this polycrystalline silicon film and the films lying thereunder, namely, the second silicon nitride film 819, the polycrystalline silicon film 818a and the first silicon nitride film 808, are patterned to form a first portion 812 of the first electrode and a second portion 818 of the first electrode. Then, by wet-etching, the silicon nitride films 819 and 808 as pad materials under the first and second portions 812 and 818 of the first electrode are removed as shown in FIG. 6B.

Thereafter, in the same manner as in the fabrication of the structure of the first embodiment, there are formed a dielectric film 813, a second electrode 814, an interlayer insulating film 815, a second contact hole 816 and a bit line 817 as shown in FIG. 5.

According to this second embodiment of the invention, the area of the first electrodes is enlarged so that it has been made possible to achieve a larger capacitance of the capacitor as compared with that in the first embodiment.

The foregoing has described the preferred embodiments of the invention, but the invention is not limited to these embodiments as various modifications can be made therefrom. For example, in the second embodiment, the first electrodes serving as the charge storage nodes are formed by two polycrystalline silicon films but there may be a larger number of polycrystalline silicon films for forming the first electrodes.

Further, the polycrystalline silicon film may first be formed as a non-doped film and, subsequently, impurities may be doped by methods such as diffusion and ion-implantation. Also, the dielectric film may be formed by the CVD process or may be formed of a film other than oxide films.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device having a memory cell of a stacked capacitor type, said method comprising the steps of:

forming a MIS transistor which has a gate electrode formed on a semiconductor substrate through a gate insulating film, and a first source/drain region and a second source/drain region formed within a surface region respectively at two sides of said gate electrode on said semiconductor substrate, and which is covered by a first insulating film;

forming a pad material layer and a second insulating film in this order on said first insulating film;

forming a contact hole in said first and second insulating films and said pad material layer so as to expose a surface of said first source/drain region;

forming a conductive plug which fills an inside of said contact hole and which is in contact with the surface of said first source/drain region;

removing said second insulating film;

forming a first electrode of a capacitor which is in contact with an upper surface of said conductive plug and which extends outwardly from an upper portion of said conductive plug;

forming, after a removal of said pad material layer under said first electrode, a dielectric film covering an entire surface of said first electrode and partial side portions of said conductive plug; and forming a second electrode of said capacitor which fully surrounds said first electrode through said dielectric film.

2. A method for fabricating a semiconductor device having a memory cell of a stacked capacitor type, said method comprising the steps of:

forming a MIS transistor which has a gate electrode formed on a semiconductor substrate through a gate insulating film, and a first source/drain region and a second source/drain region formed within a surface region respectively at two sides of said gate electrode on said semiconductor substrate, and which is covered by a first insulating film;

forming in a stacked relationship a first pad material layer, a polycrystalline silicon film, a second pad material layer, and a second insulating film on said first film;

forming a contact hole in said polycrystalline silicon film, said first and second insulating films and said first and second pad material layers so as to expose a surface of said first source/drain region;

forming a conductive plug which fills an inside of said contact hole and which is in contact with the surface of said first source/drain region;

removing said second insulating film;

forming a first portion of a first electrode of a capacitor which is in contact with an upper portion of said conductive plug and extends outwardly from the upper portion of said conductive plug;

forming said polycrystalline silicon film into a second portion of said first electrode by extending said polycrystalline silicon film outwardly from sides of said conductive plug between said first portion of said first electrode and said first insulating film;

removing said first and second pad material layers respectively under the second and first portions of said first electrode, and then forming a dielectric film covering entire surfaces of said first and second portions of said first electrode and sidewalls of said conductive plug; and forming a second electrode surrounding said first and second portions of said first electrode through said dielectric film.

3. A method for fabricating a semiconductor device having a memory cell of a stacked capacitor type, said method comprising the steps of:

forming a MIS transistor having a gate electrode and a first source/drain region and a second source/drain region within a region defined by an element isolation region on a semiconductor substrate;

forming an insulating layer and a pad material layer on said semiconductor substrate;

forming a contact hole by selectively removing said insulating layer and said pad material layer to expose one of said first and second source/drain regions of said MIS transistor;

forming a conductive plug, which fills an inside of said contact hole, by forming a first conductive material layer and etching back this layer;

forming a first electrode, which is in contact with an upper surface of said conductive plug and extends outwardly from said upper surface of said conductive plug, by forming a second conductive material layer and, after patterning this layer, etching and removing said pad material layer under a lower surface of said first electrode;

forming a dielectric film on an entire surface of said first electrode and a part of a sidewall of said conductive plug; and forming a second electrode[,]which surrounds said first electrode through said dielectric film, said second electrode being formed by depositing a third conductive material layer and patterning this layer.

4. A method for fabricating a semiconductor device according to claim 3, in which said first conductive material layer is a polycrystalline silicon film, and said conductive plug is formed by etching back said polycrystalline silicon film to leave said polycrystalline silicon film in said contact hole.

* * * * *